(12) United States Patent
Meyer-Berg et al.

(10) Patent No.: US 9,171,804 B2
(45) Date of Patent: Oct. 27, 2015

(54) METHOD FOR FABRICATING AN ELECTRONIC COMPONENT

(71) Applicant: Infineon Technologies AG, Neubiberg (DE)

(72) Inventors: Georg Meyer-Berg, Munich (DE); Khalil Hosseini, Weihmichl (DE); Joachim Mahler, Regensburg (DE); Edward Fuergut, Dasing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/681,079

(22) Filed: Nov. 19, 2012

(65) Prior Publication Data

US 2014/0138843 A1    May 22, 2014

(51) Int. Cl.
*H01L 21/58* (2006.01)
*H01L 21/78* (2006.01)
*H01L 23/538* (2006.01)
*H01L 23/00* (2006.01)
*H01L 23/495* (2006.01)
*H01L 21/56* (2006.01)

(52) U.S. Cl.
CPC .......... *H01L 23/5384* (2013.01); *H01L 21/563* (2013.01); *H01L 21/58* (2013.01); *H01L 21/78* (2013.01); *H01L 23/49513* (2013.01); *H01L 23/49562* (2013.01); *H01L 24/29* (2013.01); *H01L 24/32* (2013.01); *H01L 24/83* (2013.01); *H01L 2224/32245* (2013.01); *H01L 2224/83191* (2013.01); *H01L 2224/83194* (2013.01); *H01L 2224/83203* (2013.01); *H01L 2224/83207* (2013.01); *H01L 2224/83439* (2013.01); *H01L 2224/83455* (2013.01); *H01L 2924/1305* (2013.01); *H01L 2924/13055* (2013.01); *H01L 2924/13091* (2013.01); *H01L 2924/1461* (2013.01); *H01L 2924/15747* (2013.01)

(58) Field of Classification Search
CPC ................... H01L 21/563; H01L 2225/06513; H01L 23/295; H01L 23/36; H01L 2224/97; H01L 2224/81; H01L 2224/83; H01L 2924/18161; H01L 23/481; H01L 21/56; H01L 23/49575; H01L 23/562
USPC ............ 257/774, 76, E21.599, E21.502, 787, 257/416, 676; 438/15, 109, 107
See application file for complete search history.

(56) References Cited

U.S. PATENT DOCUMENTS

| | | | |
|---|---|---|---|
| 6,081,037 A * | 6/2000 | Lee et al. ........ | 257/778 |
| 8,518,304 B1 * | 8/2013 | Sammakia et al. ...... | 252/500 |
| 2002/0113131 A1 | 8/2002 | Puschner et al. | |
| 2005/0269690 A1 * | 12/2005 | Meyer-Berg ............. | 257/707 |
| 2007/0025092 A1 | 2/2007 | Lee et al. | |
| 2011/0278350 A1 * | 11/2011 | Guinn .................. | 228/179.1 |
| 2012/0104603 A1 | 5/2012 | Kumbhat et al. | |

(Continued)

FOREIGN PATENT DOCUMENTS

DE    11 2010 002 901 T5    8/2012

*Primary Examiner* — Cathy N Lam
(74) *Attorney, Agent, or Firm* — Slater & Matsil, L.L.P.

(57) ABSTRACT

A carrier and a semiconductor chip are provided. A connection layer is applied to a first main face of the semiconductor chip. The connection layer includes a plurality of depressions. A filler is applied to the connection layer or to the carrier. The semiconductor chip is attached to the carrier so that the connection layer is disposed between the semiconductor chip and the carrier. The semiconductor chip is affixed to the carrier.

12 Claims, 5 Drawing Sheets

(56) References Cited

U.S. PATENT DOCUMENTS

| | | | |
|---|---|---|---|
| 2013/0026643 A1* | 1/2013 | England et al. | 257/774 |
| 2013/0154122 A1* | 6/2013 | Topacio et al. | 257/778 |
| 2014/0057098 A1* | 2/2014 | Maekawa et al. | 428/323 |
| 2014/0103527 A1* | 4/2014 | Marimuthu et al. | 257/737 |

* cited by examiner

METHOD FOR FABRICATING AN ELECTRONIC COMPONENT

TECHNICAL FIELD

The present invention relates to a method for fabricating an electronic component and to an electronic component.

BACKGROUND

In many electronic components a semiconductor chip has to be mounted onto a carrier, in particular an electrically conductive carrier like, for example, a leadframe. It is important that the connection between the semiconductor chip and the carrier is of high reliability and exhibits high electrical and thermal conductivity. During and after the mounting process of the semiconductor chip onto the carrier, however, problems may occur depending on the applied fixation technology. The problems may arise, for example, from different thermal expansion coefficients of the semiconductor material and the carrier material which may lead to thermal mechanical stress. In case of thinned semiconductor chips these stress reactions may even lead to microscopic damage of the semiconductor chip like the formation of cracks. In other cases the stress may lead to a strong deformation of the semiconductor substrate so that the following process steps are no long possible like, for example, laser drilling, lamination, wire bonding, etc. In general the stress generated in the semiconductor chip severely affects the reliability of the following process steps. Therefore, there is a need for an interconnection technology which is able to provide a stable and permanently reliable connection between a semiconductor chip and a carrier with high electrical and thermal conductivity.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2, show a schematic cross-sectional side view representation (FIG. 2A) and a down view representation (FIG. 2B) of a semiconductor chip with contact pillars to illustrate a method for fabricating an electronic component according to an embodiment;

DETAILED DESCRIPTION OF ILLUSTRATIVE EMBODIMENTS

Figure 1:
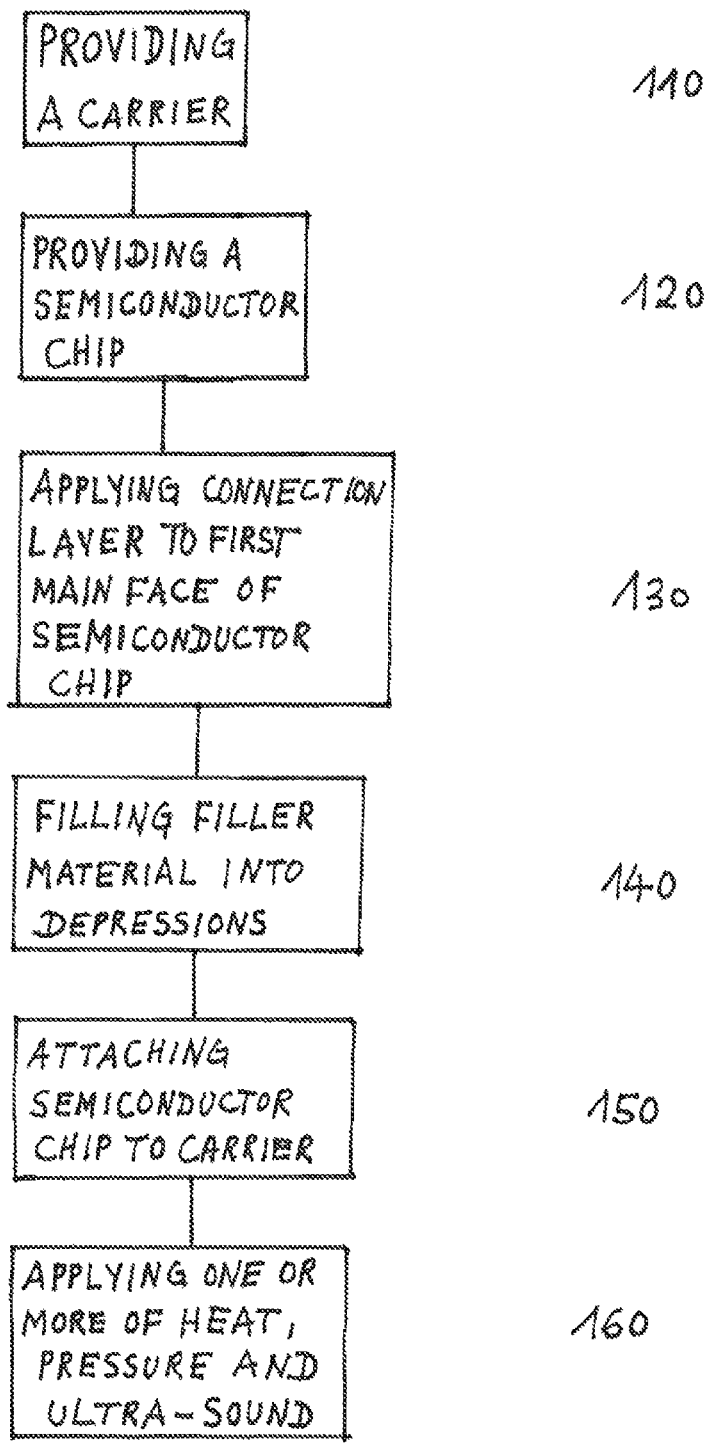
FIG. 1 shows a flow diagram of a method for fabricating an electronic component according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic component and a method for fabricating an electronic component may use various types of semiconductor chips or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor or other structures or devices in which at least one electrical contact pad is arranged on a first main face of the semiconductor chip and at least one other electrical contact pad is arranged on a second main face of the semiconductor chip opposite to the first main face of the semiconductor chip.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor chip. The contact elements or contact pads may be made from any electrically conducting material, e.g., from a metal as aluminum, gold, or copper, for example, or a metal alloy, or an electrically conducting organic material, or an electrically conducting semiconductor material.

In the claims and in the following description different embodiments of a method for fabricating an electronic component are described as a particular sequence of processes or measures, in particular in the flow diagram. It is to be noted that the embodiments should not be limited to the particular sequence described. Particular ones or all of different processes or measures can also be conducted simultaneously or in any other useful and appropriate sequence.

Referring to FIG. 1, a flow diagram of a method for fabricating an electronic module is shown. The method 100 of FIG. 1 comprises providing a carrier (110), providing a semiconductor chip (120), applying a connection layer to a first main face of the semiconductor chip, the connection layer comprising a plurality of depressions (130), applying a filler material to the connection layer or to the carrier (140), attaching the semiconductor chip with the connection layer to the carrier (150), and applying one or more of heat, pressure and ultra-sonic to fix the semiconductor chip to the carrier (160).

The filler material can either be filled directly into the depressions of the connection layer or it can be applied onto the connection layer above the pillars defining the depressions between them or it can be applied to the carrier. Due to the subsequent treatment, the filler material may flow into the depressions so that the depressions may be completely filled with the filler material.

According to an embodiment of the method 100 of FIG. 1, the carrier is comprised of an electrically conductive material. In particular, the carrier can be comprised of a leadframe or any other metallic carrier. The carrier can also be comprised of an insulating material having metallized areas on a main face thereof or of a printed circuit board (PCB) or any other substrate.

According to an embodiment of the method 100 of FIG. 1, the semiconductor chip comprises a first main face and a second main face opposite to the first main face, wherein at least one electrical contact pad is arranged on the first main face and at least one electrical contact pad is arranged on the second main face. According to an embodiment thereof, the semiconductor chip comprises a vertical transistor structure like, for example, an IGBT (Insulated Gate Bipolar Transistor) structure.

According to an embodiment of the method 100 of FIG. 1, the semiconductor chip may comprise any kind of electrical device or electrical circuit incorporated in the semiconductor chip, in particular one or more of a logic integrated circuit, an analog integrated circuit, a mixed signal integrated circuit, a sensor circuit, a MEMS (Micro-Electro-Mechanical-Systems), a power integrated circuit, a transistor like, for example, an MOS transistor, a power transistor, an IGBT transistor, or a vertical transistor.

According to an embodiment of the method 100 of FIG. 1, the depressions of the connection layer can have any desired form and shape. In particular, the depressions can have equal form and shape or they can be different in form and shape wherein also a part of the plurality of depressions can be equal in form and shape. The depressions or part of them can have a depth so that they reach through the layer until the first main face of the semiconductor chip, or the depressions or part of them can have a depth so that they do not reach through the layer until the first main face of the semiconductor chip. The depressions or part of them can have vertical side walls. The depressions can have a rectangular-shaped cross-section. The topology of the pillars can also be adjusted to the topology of the carrier, e.g., the bump tips may define at least a plane for a planar carrier.

According to an embodiment of the method 100 of FIG. 1, the depressions can be defined by pillars of the connection layer wherein the depressions are comprised of intermediate spaces between the pillars. The pillars can have a lateral size in a range from 5 µm-50 µm and a height in a range from 10 µm-30 µm, for example. The distances between the pillars can be in a range from 5 µm-50 µm. The size of the pillars and the distances between the pillars can be chosen such that the depressions formed by the intermediate spaces between the pillars are contiguous or non-contiguous. According to one example, the pillars and the intermediate spaces between them are formed to a regular pattern, in particular to a checkered pattern, in which case the pillars and the intermediate spaces between them occupy identical space volumes or, in case of very many pillars or big area pillars, the pillars may occupy only a fraction of the total area with increased pitch between the pillars.

According to an embodiment of the method 100 of FIG. 1, the connection layer may be generated by applying a connection base layer to the main face of the semiconductor chip and then removing predetermined portions of the connection base layer. The predetermined portions of the connection base layer can be removed by laser structuring or by etching.

According to an embodiment of the method 100 of FIG. 1, the connection base layer can be comprised of an electrically conductive material like, for example, copper or any other metallic material.

According to an embodiment of the method 100 of FIG. 1, the connection base layer can be comprised of an insulating material.

According to an embodiment of the method 100 of FIG. 1, the connection layer comprising the plurality of depressions can be fabricated by a photolithographic method or a lift-off method.

According to an embodiment of the method 100 of FIG. 1, the filler material is comprised of one or more of a heat-shrinkable material, an electrically conductive material, an insulator material, a polymer material, an adhesive material, and anyone of the above-mentioned materials as a host material filled with particles, in particular one or more of electrically conductive particles, insulating particles, and microscopic or nanoscopic particles.

According to an embodiment of the method 100 of FIG. 1, the semiconductor chip is comprised of a semiconductor chip region of a semiconductor wafer, the semiconductor wafer comprising multiple semiconductor chip regions. The multiple semiconductor chip regions may comprise a common first main face. The connection layer may be applied on a wafer level basis and, in particular, also the filling of the filler material into the depressions may be performed on a wafer level basis. Thereafter, the semiconductor wafer may be separated into individual semiconductor chips. One of the semiconductor chips may then be attached to a carrier and fixed to it as described before.

Figure 2A:
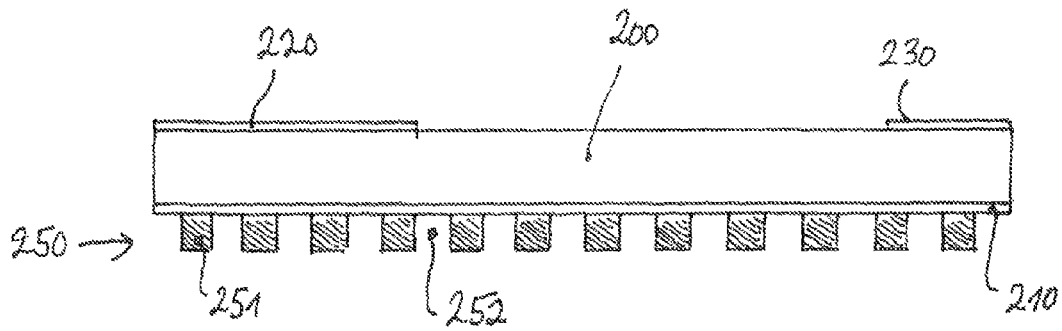
FIGS. 2A and 2B, collectively
Figure 2B:
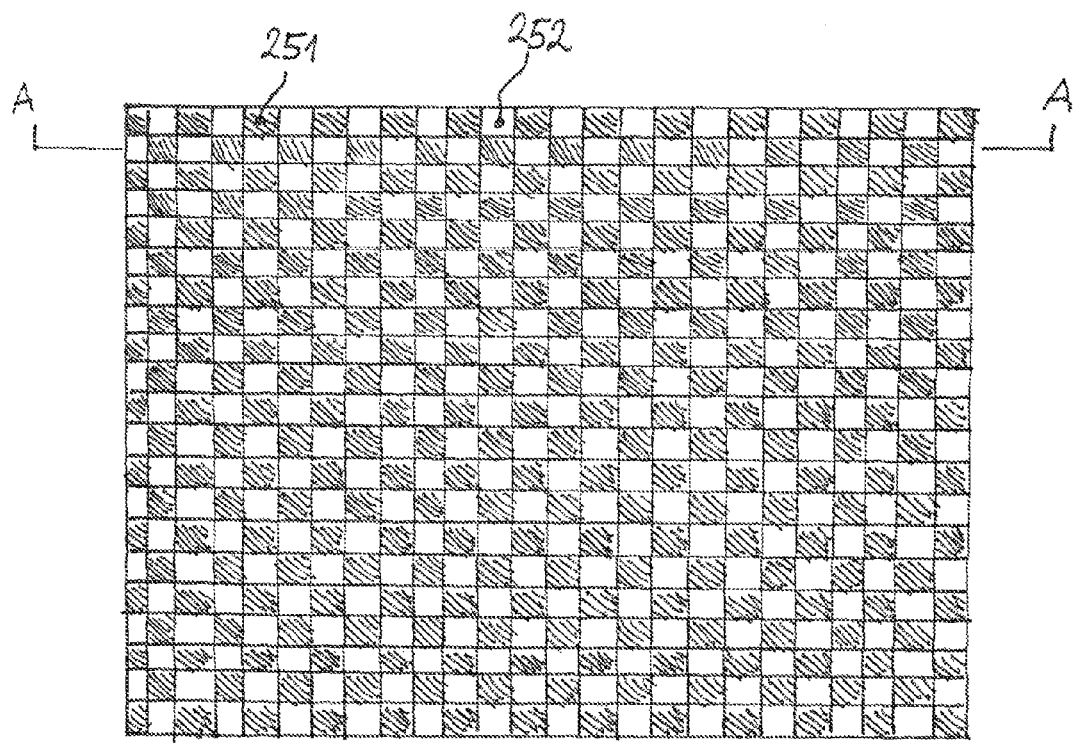
Figure 3:
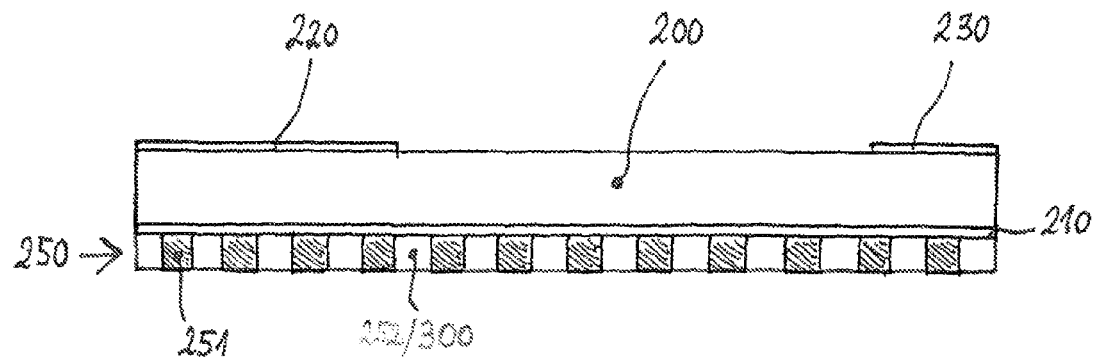
FIG. 3 shows a schematic cross-sectional side view representation of the assembly of FIG. 2 after filling a filler material into the intermediate spaces between the contact pillars.
Figure 4:
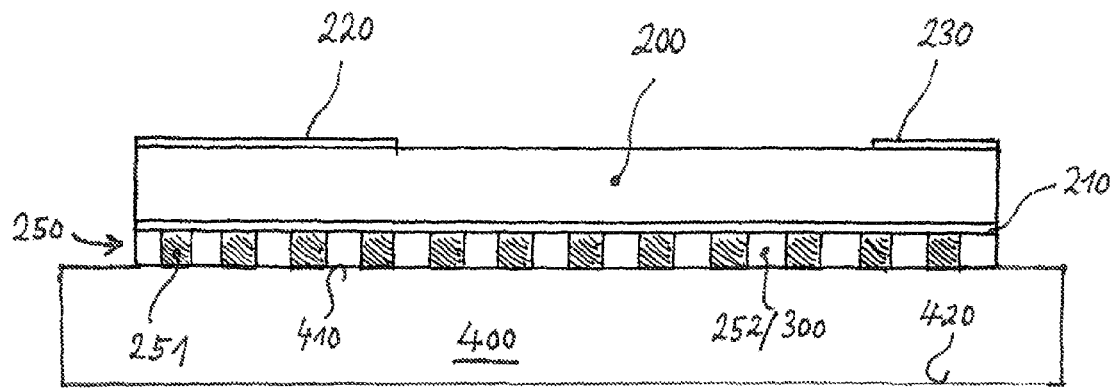
FIG. 4 shows a schematic cross-sectional side view representation of an electronic component obtained after attaching the assembly of FIG. 3 onto a leadframe.

Referring to FIGS. 2 to 4, there are shown schematic representations for illustrating a method for fabricating an electronic component. FIGS. 2A and 2B show a schematic cross-sectional representation (A) and a down view representation (B) of a semiconductor chip 200 and a connection layer 250 applied to the semiconductor chip 200. FIG. 2A is a cross-section along line A-A of FIG. 2B. The semiconductor chip 200 can be comprised of, for example, a silicon chip and can be further comprised of a chip having a first contact layer 210 disposed on a first main face of the semiconductor chip 200 and second and third contact layers 220 and 230 disposed on a second main face opposite to the first main face. The semiconductor chip 200 can, for example, be comprised of a vertical transistor chip like, for example, an IGBT (Insulated Gate Bipolar Transistor). The first, second and third contact layers 210, 220 and 230 can be the drain, source and gate contact layers of an IGBT. The semiconductor chip 200 can have a thickness in a range from 50 μm-800 μm, in particular from 50 μm-300 μm, in particular from 50 μm-100 μm. The semiconductor chip 200 can either be an individual semiconductor chip or a semiconductor chip region within a semiconductor wafer.

The connection layer 250 can be comprised of a regular array of contact pillars 251 and intermediate spaces (depressions) 252 between the contact pillars 251. As shown in FIG. 2B, the arrangement of contact pillars 251 and intermediate spaces 252 can be that of a checker board pattern which means that the total number of contact pillars 251 and the total number of intermediate spaces 252 occupy identical space volumes. In the embodiment shown in FIG. 2B, the intermediate spaces 252 are separated from each other. However, it can also be the case that the contact pillars 251 have smaller lateral dimensions or greater distances between each other so that the intermediate spaces 252 between the contact pillars 251 are connected with each other and form a contiguous empty space between die contact pillars 251. The contact pillars 251 can have a rectangular cross-section and vertical side walls and the intermediate spaces 252 can also have rectangular cross-sections and vertical side walls. The pillars 251 can also have any other desired shapes, e.g., Y-, U-, I-, or X-like shapes, and also non-vertical sidewalls, preferably those with an angle of over 90° versus the plane. The contact pillars 251 can have a width, i.e., a lateral edge length in a range from 5 μm-50 μm and a height in a range from 5 μm-30 μm. The contact pillars 251 can be made of a metallic material like, for example, copper. They can be fabricated by depositing a copper layer and thereafter removing predetermined portions by, for example, photolithographic technology and etching. The predetermined portions are intended to become the intermediate spaces 252. As an alternative it is also possible to deposit the copper layer through a mask, wherein the masking portions of the mask define areas where no copper is to be deposited, i.e., regions corresponding to the intermediate spaces 252.

Referring to FIG. 3, there is shown a schematic cross-sectional representation of the assembly as shown in FIG. 2A after depositing a filler material 300 into the intermediate spaces 252. The filler material 300 can be one or more of a heat-shrinkable material, an electrically conductive material, an insulator material, an adhesive material, a polymer material, a non-conductive paste (NCP), a non-conductive foil, and any kind of host material filled with particles, in particular conductive particles or insulating particles, in particular microscopic or nanoscopic particles. The filler material can, in particular, be comprised of an intrinsically conductive polymer like, for example, doped or undoped polythiophen (Poly-(3,4-ethylendioxythiopen), which can be filled with electrically conductive or insulating particles. The filler material 300 can be deposited by different methods and technologies depending on the kind and nature of the filler material 300. The filler material 300 can, for example, be filled into or over the intermediate spaces 252 by spin-coating, lamination, printing, or coating by means of a doctor blade or a squeegee.

Referring to FIG. 4, there is shown a cross-sectional representation of the assembly of FIG. 3 after attaching it to a carrier 400 like, for example, a leadframe. The leadframe 400 can, for example, be made of copper or a copper alloy. The leadframe 400 may comprise a first, upper surface 410 and a second, lower surface 420 opposite to the upper surface 410. The leadframe 400 can have a silver or nickel plating of a thickness in a range from 500 nm-5 μm at an entire surface thereof or only on the first surface 410 where electrical devices are to be connected.

The assembly shown in FIG. 3 comprising the semiconductor chip 200, the connection layer 250 and the filling material 300 is attached to the first surface 410 of the leadframe 400. Then one or more of pressure, heat, and ultrasound can be applied in order to fix the semiconductor chip to the leadframe 400 so that at first only a form-fit connection between the semiconductor chip 200, the connection layer 250, the filling material 300 and the leadframe 400 is established. Pressure can be exerted from above and below to press the semiconductor chip 200 and the leadframe 400 together and a temperature in a range from 100° C.-250° C., or 150° C. to 200° C., can be applied for 1-10 min to fix the lower surface of the connection layer 250 and the filling material 300 to the upper surface of the leadframe 400. As an alternative to the heat treating or in addition thereto, ultra-sonic radiation can be directed to the junction between the semiconductor chip 200 and the leadframe 400.

A result of such a treatment, as described above, will be that an adhesive bond is developed between the filler material 300 and the contact pillars 251, between the filler material 300 and the leadframe 400, and between the contact pillars 251 and the leadframe 400. The heat-shrinkability of the filler material 300 can be irreversible by nature of the filler material so that the adhesive bond between these components will be stable and permanently reliable. In operation of the electrical device of the semiconductor chip, in particular a vertical transistor, the adhesive bond can be even further enhanced due to the applied voltage and the current flowing through the contacts due to electro-diffusion and electro-migration and the resulting diffusion of atoms from one side of anyone of the contact junctions to the other side. Furthermore, the filler material 300 may act as a barrier for mechanically induced cracks or tears which may occur in the connection layer, i.e., the contact pillars 251. As a result, there is not only an advantage as regards the stability of the connection as also with respect to electromigration issues that arise from solder based contacting.

Figure 5:
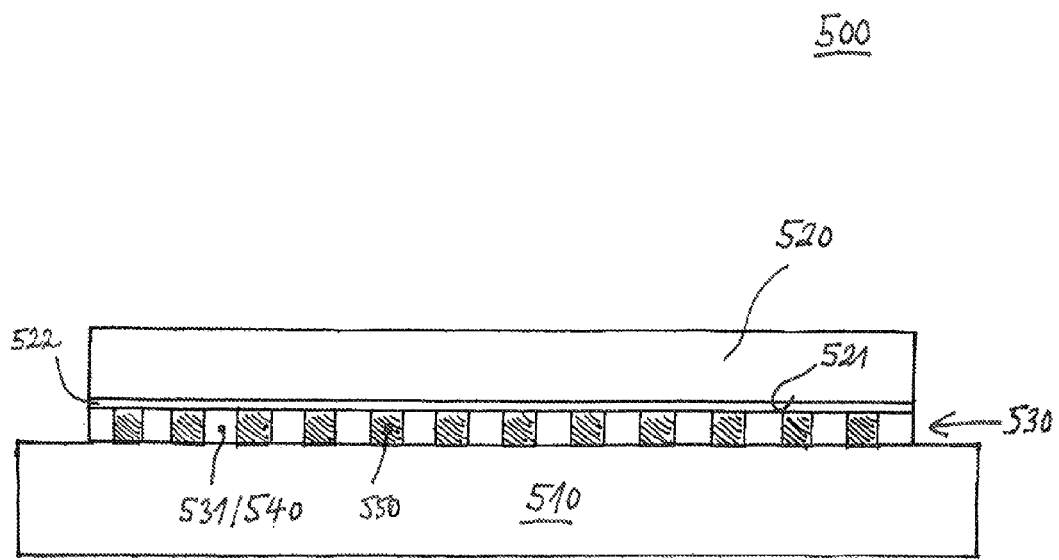
FIG. 5 shows a schematic cross-sectional side view representation of an electronic component according to an embodiment.

Referring to FIG. 5, there is shown a schematic cross-sectional side view representation of an electronic component according to an embodiment. The electronic component 500 comprises a carrier 510, a semiconductor chip 520 comprising a main face 521 and a first contact layer 522 at the back surface, a connection layer 530 applied to the main face 521 of the semiconductor chip 520, the connection layer 530 comprising a plurality of depressions 531, a filler material 540 disposed within the depressions 531, wherein the connection layer 530 is disposed between the semiconductor chip 520 and the carrier 510.

The electronic component can have any further feature as described above in connection with the fabrication method. Only a few important features will be described in the following.

According to an embodiment of the electronic component 500 of FIG. 5, the carrier 510 is comprised of an electrically conductive material. In particular, the carrier 510 can be comprised of a leadframe or any other metallic carrier. The carrier 510 can also be comprised of an insulating material having metallized areas on a main face thereof or of a printed circuit board (PCB) or any other substrate.

According to an embodiment of the electronic component 500 of FIG. 5, the semiconductor chip 520 comprises a first main face and a second main face opposite to the first main face, wherein at least one electrical contact pad is arranged on the first main face and at least one electrical contact pad is arranged on the second main face. According to an embodiment thereof, the semiconductor chip 520 comprises a vertical transistor structure like, for example, an IGBT (Insulated Gate Bipolar Transistor) structure.

According to an embodiment of the electronic component 500 of FIG. 5, the semiconductor chip 520 may comprise any kind of electrical device or electrical circuit incorporated in the semiconductor chip, among them a logic integrated circuit, an analog integrated circuit, a mixed signal integrated circuit, a sensor circuit, a MEMS (Micro-Electro-Mechanical-Systems), a power integrated circuit, a transistor like, for example, an MOS transistor, an IGBT transistor, or a vertical transistor.

According to an embodiment of the electronic component 500 of FIG. 5, the depressions 531 of the connection layer 530 can have any desired form and shape. In particular, the depressions 531 can have equal form and shape or they can be different in form and shape, wherein also a part of the plurality of depressions 531 can be equal in form and shape. The depressions 531 or part of them can have a depth so that they reach through the layer 530 until the first main face 521 of the semiconductor chip 520, or the depressions 531 or part of them can have a depth so that they do not reach through the layer 530 until the first main face 521 of the semiconductor chip 520. The depressions 531 or part of them can have vertical side walls. The depressions 531 can have a rectangular-shaped cross-section.

According to an embodiment of the electronic component 500 of FIG. 5, the depressions 531 can be defined by pillars 550 of the layer 530, wherein the depressions 531 are comprised of intermediate spaces between the pillars 550. The pillars 550 can have a lateral size in a range from 5 μm-50 μm and a height in a range from 10 μm-30 μm, for example. The distance between the pillars 550 can be in a range from 5 μm-500 μm or more. The size of the pillars 550 and the distance between the pillars 550 can be chosen such that the depressions 531 formed by the intermediate spaces between the pillars 550 are contiguous or non-contiguous. According to one example, the pillars 550 and the intermediate spaces between them are formed to a regular pattern, in particular to a checkered pattern, in which case the pillars 550 and the intermediate spaces between them occupy identical space volumes. According to an embodiment the area occupied by the pillars 550 is much smaller compared with the total area.

According to an embodiment of the electronic component 500 of FIG. 5, the connection layer 530 or the pillars 550 can be comprised of an electrically conductive material like, for example, copper or any other metallic material.

According to an embodiment of the electronic component 500 of FIG. 5, the connection layer 530 or the pillars 550 can be comprised of an insulating material.

According to an embodiment of the electronic component 500 of FIG. 5, the connection layer 530 comprising the plurality of depressions can be fabricated by a photolithographic method or a lift-off method.

According to an embodiment of the electronic component 500 of FIG. 5, the filler material 540 is comprised of one or more of a heat-shrinkable material, an electrically conductive material, an insulator material, a polymer material, an adhesive material, and anyone of the above-mentioned materials as a host material filled with particles, in particular one or more of electrically conductive particles, insulating particles and microscopic or nanoscopic particles.

Figure 6:
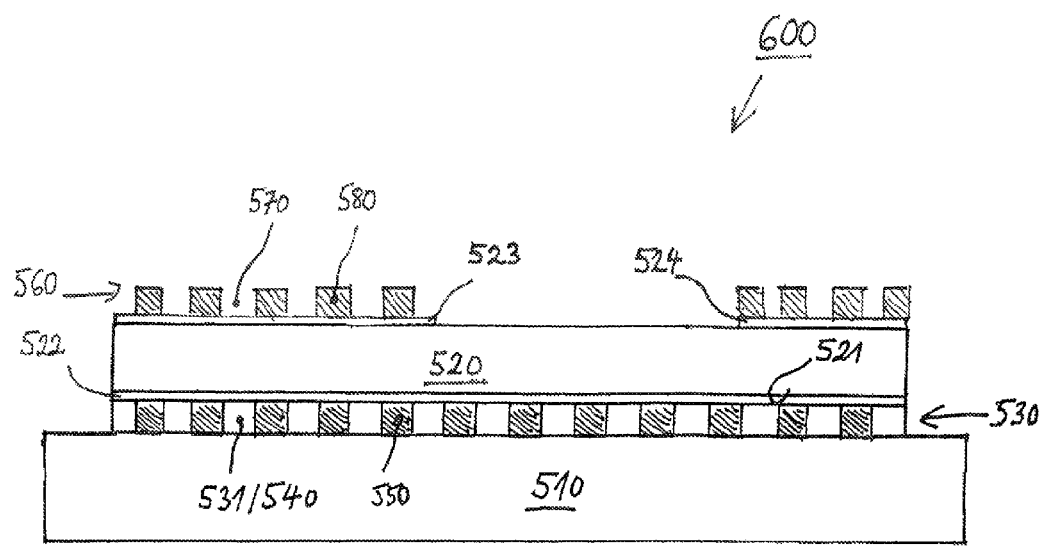
FIG. 6 shows a schematic cross-sectional side view representation of an electronic component according to an embodiment.

Referring to FIG. 6, there is shown a schematic cross-sectional side view representation of an electronic component according to an embodiment. The electronic component 600 of FIG. 6 is a further development of the electronic component 500 of FIG. 5. As far as the same reference signs are used, the description of the respective elements will not be repeated here. The electronic component 600 in addition comprises second and third contact layers 523 and 524 on a front surface of the semiconductor chip 520, wherein a further connection layer 560 is applied to the contact layers 523 and 524. The connection layer 560 can be formed in the same way as the connection layer 530, namely by comprising depressions 570 defined by pillars 580. In a later stage connection elements may be connected to the connection layer 560 by use of a filler material in the same way as described above for the backside of the semiconductor chip.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic component, comprising:
a carrier;
a semiconductor chip comprising a main face;
a connection layer disposed on the main face of the semiconductor chip, the connection layer comprising a plurality of depressions, wherein the connection layer is disposed between the semiconductor chip and the carrier, and wherein the depressions or part of them have a depth so that they do not reach the main face of the semiconductor chip; and
a filler material disposed in the depressions of the connection layer.

2. The electronic component according to claim 1, wherein the filler material comprises a heat-shrinkable material.

3. The electronic component according to claim 1, wherein the filler material comprises an adhesive material.

4. The electronic component according to claim 1, wherein the filler material comprises a host material filled with conductive particles.

5. The electronic component according to claim 1, wherein the semiconductor chip comprises an electrical device having a first electrical contact element at the main face and a second contact element at a further main face opposite to the main face.

6. The electronic component according to claim 5, wherein the electrical device comprises a vertical transistor, an MOS transistor, an IGB transistor, or a power transistor.

7. The electronic component according to claim 5, further comprising an electrically conductive layer disposed onto the first electrical contact element, wherein the depressions are formed into the electrical conductive layer.

8. The electrical component according to claim 1, wherein the semiconductor chip further comprises a further main face opposite to the main face, the electrical component further comprising a further connection layer disposed on the further main face of the semiconductor chip, the further connection layer comprising a plurality of depressions.

9. The electronic component according to claim 1, wherein the depressions are formed as columns, the columns having vertical side faces.

10. The electronic component according to claim 1, wherein the depressions have one or more of equal form, equal dimensions and equal distances from each other.

11. The electronic component according to claim 1, wherein the depressions are arranged in a regular manner.

12. The electronic component according to claim 1, wherein the filler material is an electronically conductive material.

* * * * *